Figure 1:
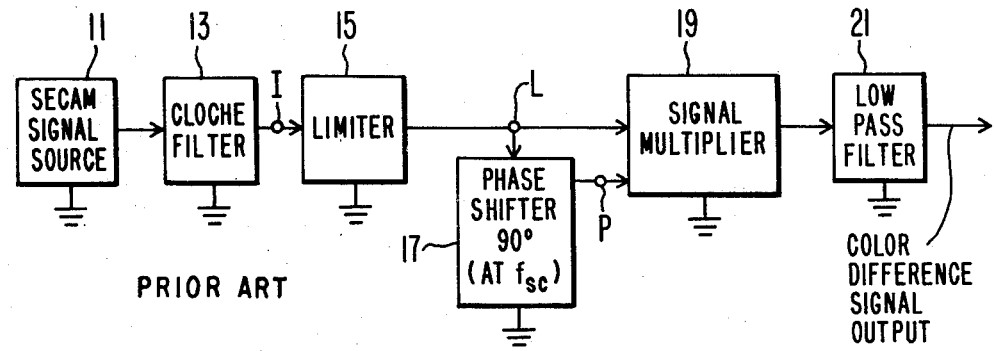

United States Patent [19]

Hinn

[11] 4,232,268
[45] Nov. 4, 1980

[54] SECAM CHROMA DEMODULATOR CIRCUIT

[75] Inventor: Werner Hinn, Zollikerberg, Switzerland

[73] Assignee: RCA Corporation, New York, N.Y.

[21] Appl. No.: 3,028

[22] Filed: Jan. 12, 1979

[30] Foreign Application Priority Data

Jan. 18, 1978 [GB] United Kingdom ............... 02067/78

[51] Int. Cl.² .............................................. H03D 3/14
[52] U.S. Cl. .................................... 329/103; 329/134; 329/137; 358/23
[58] Field of Search ............... 329/103, 110, 131, 134, 329/137, 145; 325/318, 347, 349, 487; 358/23

[56] References Cited

U.S. PATENT DOCUMENTS

| | | | |
|---|---|---|---|
| 3,548,326 | 12/1970 | Bilotti | 329/134 X |
| 3,678,405 | 7/1972 | Avins | 330/260 |
| 4,100,500 | 7/1978 | Ohsawa et al. | 329/103 |

FOREIGN PATENT DOCUMENTS 1316109 5/1973 United Kingdom .
1358551 7/1974 United Kingdom .

OTHER PUBLICATIONS

"FM IF Amplifier-Limiter and Quadrature Detector", pp. 520-524 of "Linear Integrated Circuits and MOS Devices", Book SSD-201, RCA Solid State '74 Databook Series.

Primary Examiner—Siegfried H. Grimm
Assistant Examiner—Edward P. Westin
Attorney, Agent, or Firm—E. M. Whitacre; W. H. Meagher

[57] ABSTRACT

SECAM subcarrier demodulator employs a multistage limiter-amplifier to supply two inputs to a signal multiplier, one input being supplied directly and the other input being supplied via a phase shifter which imparts a phase shift of 90° at one of the SECAM subcarrier resting frequencies. Positive feedback is associated with the final amplifier stage of the limiter-amplifier to provide said stage with a hysteresis characteristic ensuring development of a limiter output with a rectangular waveshape having rise and fall times of substantial constancy, independent of input signal amplitude variations. Negative DC feedback from the penultimate amplifier stage to the input amplifier stage of the limiter-amplifier assures desired symmetry of limiting action. Color difference signal output is obtained by low pass filtering of the products of multiplication of the respective signal inputs.

8 Claims, 4 Drawing Figures

SECAM CHROMA DEMODULATOR CIRCUIT

The present invention relates generally to novel apparatus for recovering color-difference signal information from a chrominance signal encoded in SECAM-fashion, and particularly to such apparatus of a form convenient for realization in integrated circuit form.

In a SECAM color television transmission, R-Y and B-Y color-difference signals frequency modulate respective subcarriers (4.40625 MHz. and 4.250 MHz.) which are provided alternately on a line-by-line basis. For recovery of color-difference information from the modulated SECAM subcarriers, some form of FM detection is required.

One form of FM detector that is attractive for realization in integrated circuit form is the so-called quadrature detector, wherein a signal multiplier is supplied with two inputs, one input comprising the output of a limiter applied directly to the multiplier and the other input comprising the output of said limiter applied via a phase shifter exhibiting a 90° phase shift at the resting frequency of the FM signal. Low pass filtering of the products of multiplication of the respective signal inputs recovers the modulation information.

The RCA CA2111AE integrated circuit chip is an example of a realization of an FM detector of the quadrature detector type in a relatively simple integrated circuit form, requiring relatively few associated off-chip components. This product incorporates on the same monolithic integrated circuit chip the signal multiplier, together with an output emitter follower, and a multistage, wideband, input signal limiter-amplifier formed by three cascaded stages of a type comprising an emitter coupled amplifier driving an emitter-follower as described in U.S. Pat. No. 3,366,889—Avins.

It has been found that, when an integrated circuit quadrature detector of the general type described above is employed for SECAM subcarrier demodulation, a problem is encountered which is troublesome for the desired color-difference signal recovery: variations in the DC component of the output signal in response to variations in the amplitude of the SECAM subcarrier signal input. Variations in the DC component of the output signal of an integrated circuit quadrature detector can be of little consequence in other detector uses, such as in an FM broadcast receiver or the sound section of a television receiver, where the modulation information to be recovered does not include a DC component. However, in a SECAM subcarrier demodulation use, where the modulation information (color-difference signal) does include a DC component, spurious variations of the DC component of the detector output can result in intolerable color changes.

Variations in the amplitude of the SECAM chrominance signal input to a demodulator can be expected in a color television receiver due to such factors as transmission vagaries, receiver mistuning, etc. It has been observed that such encountered input signal amplitude changes can result in alterations of the rise and fall times of the limited signal inputs to the signal multiplier of the above-described type of quadrature detector, and such rise and fall time changes alter the relative amounts of residual carrier components and the harmonics thereof in the multiplier output in such a way that the subsequent low pass filtering results in a spurious DC level change in the recovered color-difference signal.

Pursuant to the principles of the present invention, a quadrature detector of the above-described general type is employed for SECAM subcarrier demodulation, with, however, the output DC component variation problem substantially avoided by providing one of the amplifier stages of the multi-stage limiter-amplifier (supplying inputs to the signal multiplier) with a hysteresis characteristic of a form ensuring development by the limiter-amplifier of an output signal with a rectangular waveshape possessing rise and fall times which are substantially independent of amplitude variations of the signal input to the limiter-amplifier over the variation range normally encountered in the SECAM signal reception. Preferably, the hysteresis characteristic is associated with the final amplifier stage of the limiter-amplifier, and a negative feedback path is DC coupled from the preceding amplifier stage to the input amplifier stage to achieve proper symmetry of limiting action. A limiter-detector arrangement embodying the invention is conveniently realizable in integrated circuit form with relatively few assoicated off-chip components required.

In a particular embodiment of the present invention, advantageous for use in SECAM-PAL chrominance signal conversion in the manner generally described in U.K. Pat. No. 1,358,551, the parameters of the phase shift circuit associated with one of the signal multiplier inputs are subject to line-by-line alteration to permit the single FM detector to demodulate both SECAM subcarriers on a sequential basis.

Figure 2A:
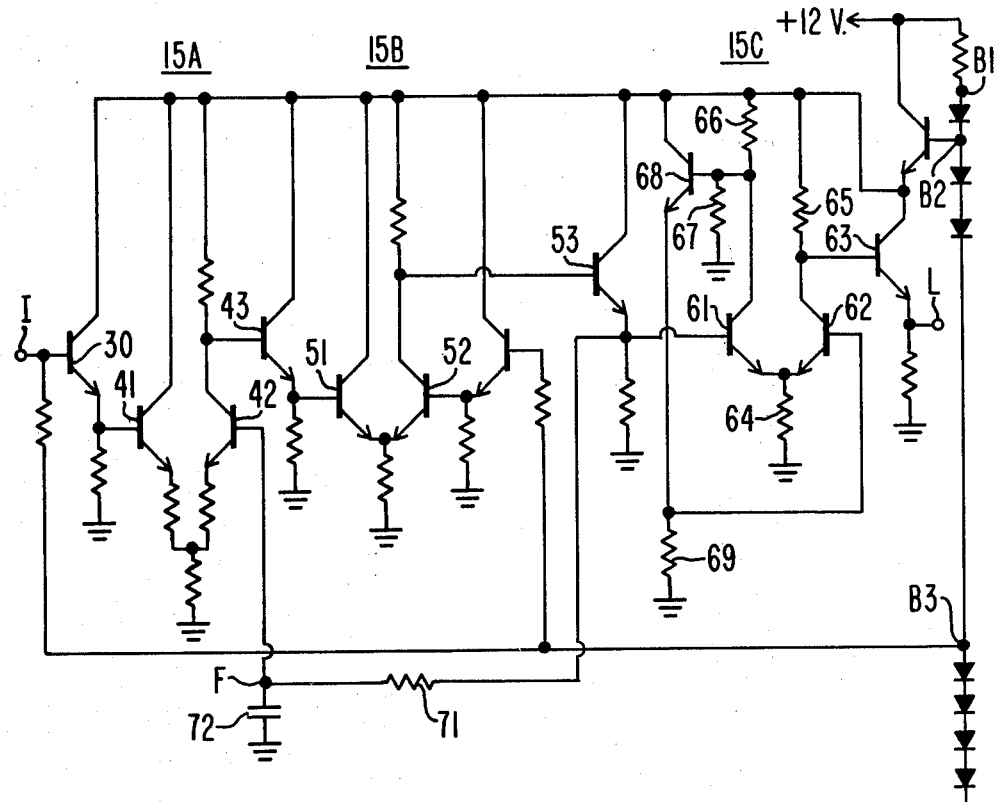
Figure 2B:
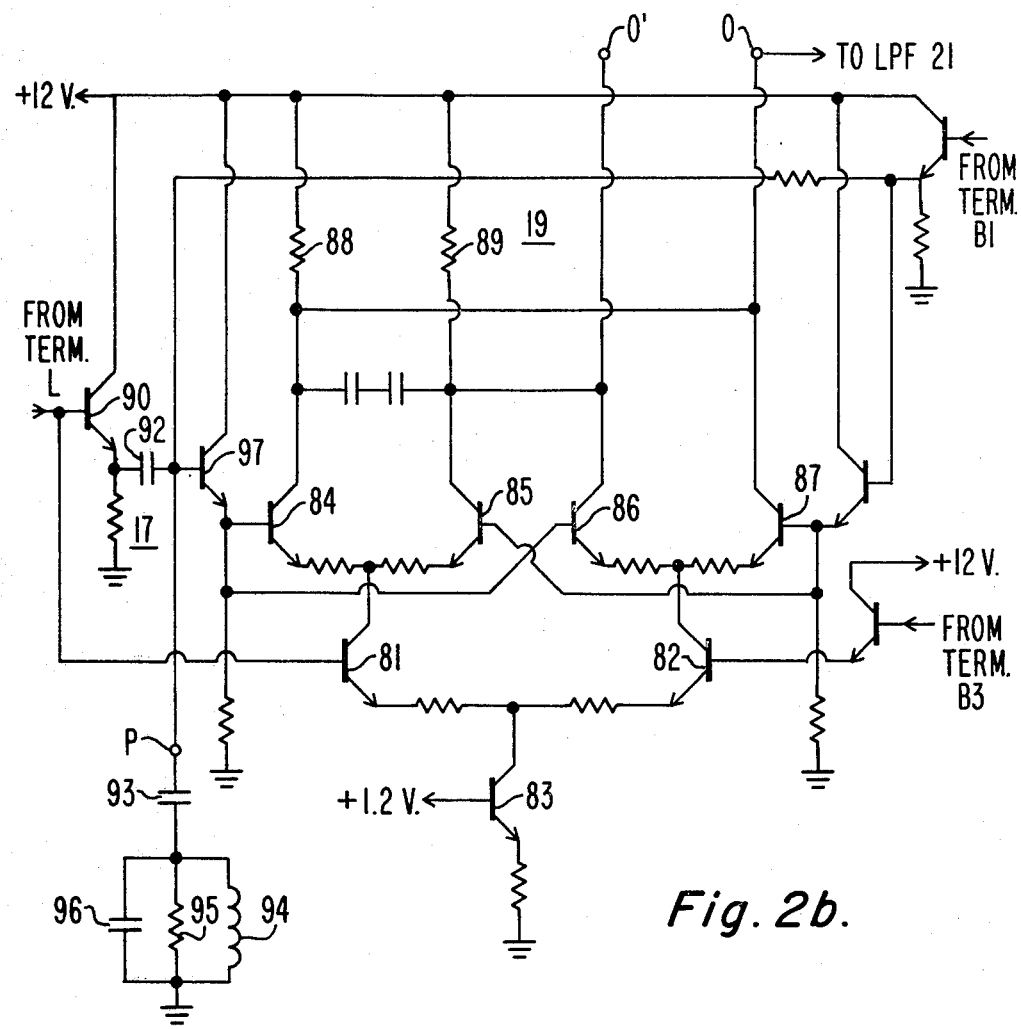
Figure 3:
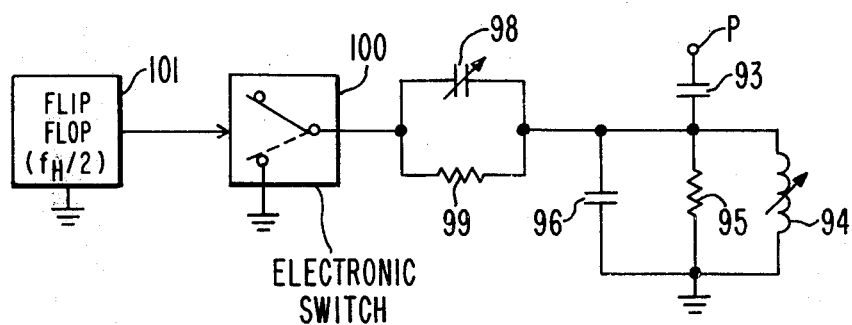

In the accompany drawings:

FIG. 1 provides a block diagram illustration of a SECAM subcarrier demodulation system employing a quadrature detector, in which system the present invention may be practiced;

FIGS. 2a and 2b schematically illustrate elements of the FIG. 1 system, configured pursuant to an illustrative embodiment of the present invention; and FIG. 3 illustrates, partially schematically and partially by block diagram representation, a modification of the circuits of FIG. 2b, pursuant to a further embodiment of the present invention.

In FIG. 1, a SECAM signal source 11 (e.g., the video detector of a SECAM color TV receiver) supplies composite video signals, incorporating a chrominance signal encoded in SECAM fashion, to a "cloche" filter 13. The cloche filter 13 comprises a bandpass filter, having a passband encompassing the bandwidth occupied by the SECAM chrominance signal, and exhibiting a characteristic shaped in a manner complementary to the characteristic which provided high frequency preemphasis of subcarrier sideband components in the SECAM signal formation.

The output of filter 13 is supplied to the input of a limiter 15. Pursuant to the principles of the present invention, the limiter 15 comprises a multi-stage limiter-amplifier in which one of the amplifier stages is provided with a hysteresis characteristic ensuring development of a rectangular waveshape at the limiter output with rise and fall times substantially independent of amplitude variations of the received subcarrier signals supplied to the input of limiter 15. The output of limiter 15 is supplied directly as one input to a signal multiplier 19. A second input to the signal multiplier 19 is supplied by a phase shifter 17, responsive to an output of limiter 15 and imparting thereto a phase shift corresponding to 90° at a selected one of the SECAM subcarrier frequencies.

The products of multiplication of the respective signal inputs appear in the output of signal multiplier 19 which is supplied to a low pass filter 21, having a cutoff frequency at or below the upper limit (1.5 MHz.) of the modulating signal band. Desirably, the low pass filter 21 incorporates circuit elements providing a video de-emphasis characteristic complementary to the modulating signal preemphasis employed in SECAM signal formation. During the line intervals occupied by a modulated subcarrier component having the selected SECAM subcarrier resting frequency, the output of low pass filter 21 comprises a color-difference signal, representing the modulation of said subcarrier component, and substantially free of spurious DC component variations.

FIGS. 2a and 2b illustrate particular circuits for implementing the functions of the limiter, phase shifter, and signal multiplier components (15, 17, 19) of the FIG. 1 arrangement, pursuant to an illustrative embodiment of the present invention. In the FIG. 2a illustration of the circuitry of limiter 15, three cascaded amplifier stages 15A, 15B and 15C are shown, each of a type employing three transistors to form an emitter-coupled amplifier driving an emitter-follower.

The input terminal I of limiter 15 is coupled, via an emitter-follower transistor 30, to the input of amplifier stage 15A at the base of transistor 41. Transistor 41 is the input transistor of an emitter-coupled pair; the output transistor 42 of this pair drives emitter-follower transistor 43. The output of emitter-follower transistor 43 is coupled to the input of intermediate amplifier stage 15B at the base of transistor 51. Transistor 51 is the input transistor of a second emitter-coupled pair; the output transistor 52 of this pair drives an emitter-follower transistor 53. The output of emitter-follower transistor 53 is coupled to the input of the final amplifier stage 15C at the base of transistor 61. Transistor 61 is the input transistor of a third emitter-coupled pair; the output transistor 62 of this pair drives the emitter-follower transistor 63, the emitter of which is directly coupled to the output terminal L of the limiter 15.

Pursuant to the principles of the present invention, a form of positive feedback is associated with the final amplifier stage 15C to provide this stage with a hysteresis characteristic ensuring substantial constancy of the rise and fall times of the rectangular waveshape developed at limiter output terminal L, despite variations of the amplitude of the chrominance signal supplied to input terminal I.

To implement provision of such a characteristic, a load resistor 66 is provided in the collector circuit of the input transistor 61 of the final emitter-coupled pair, and the collector of transistor 61 is directly connected to the base of a transistor 68 disposed in an emitter-follower configuration. Resistors 67 and 69 respectively return the base and emitter of transistor 68 to a point of reference potential. The output of emitter-follower transistor 68 is directly coupled to the base of the output transistor 62 of the final emitter-coupled pair. With provision of the aforesaid coupling via transistor 68, small changes in the input to the final amplifier stage 15C effect rapid switching of that stage between extreme states in which either input transistor 61 or output transistor 62 is cut off.

A resistor 71 is coupled between the output terminal of the intermediate amplifier stage 15B (i.e. at the emitter of emitter-follower transistor 53) and the base of the output transistor 42 of the first emitter-coupled pair. A signal bypass capacitor 72 is coupled between the base of transistor 42 and a point of reference potential. This coupling of network 71, 72 establishes a negative DC feedback which assures proper symmetry of the limiting action provided by limiter 15. This stabilizing feedback is taken from the output of the penultimate amplifier stage 15B, rather than the final amplifier stage 15C, to avoid introduction of instability.

Illustrative circuitry for the phase shifter 17 and signal multiplier 19, to be used in conjunction with the circuitry of FIG. 2a, is shown in FIG. 2b. The signal multiplier 19 is realized in a circuit form generally similar to the circuits employed for that purpose in the aforesaid CA2111AE chip. Transistors 81 and 82 are disposed in an emitter-coupled amplifier configuration, with the base of transistor 81 receiving the limiter output from terminal L, with the base of transistor 82 receiving a reference bias, and with a transistor 83 serving as a substantially constant current source coupled to the emitters of transistors 81 and 82.

A second emitter-coupled transistor pair is formed by transistors 84 and 85, with the emitters thereof driven by the collector of transistor 81. A third emitter-coupled transistor pair is formed by transistors 86 and 87, with the emitters thereof driven by the collector of transistor 82. The bases of transistor 85 of the second emitter-coupled pair, and of transistor 87 of the third emitter-coupled pair, receive in common a reference bias. The bases of transistor 84 of the second emitter-coupled pair, and of transistor 86 of the third emitter-coupled pair, receive in common the output of phase shifter 17.

The products of multiplication of the respective signal inputs appear across a load resistor 88 shared by the collector circuits of transistors 84 and 87. The multiplier output is coupled to the input of filter 21 via an output terminal O connected to the joined collector electrodes of transistors 84 and 87.

For development of auxiliary multiplier output of complementary phase, a second load resistor 89 is shared by the collector circuits of transistors 85 and 86, and an auxiliary output terminal O' is connected to the joined collector electrodes of these transistors.

In the circuit arrangement of FIG. 2b, the limiter output from terminal L is coupled via an emitter-follower transistor 90 to phase shifter 17, formed by the series combination of (a) a capacitor 92, (b) a capacitor 93, and (c) the parallel combination of coil 94, resistor 95 and capacitor 96. The output terminal P of the phase shifter 17, appearing at the junction of capacitors 92 and 93, is coupled via an emitter-follower transistor 97 to the bases of multiplier transistors 84 and 86. The values of the phase shifter elements are so related as to impart a phase shift of 90° to a signal of a selected SECAM subcarrier frequency coupled thereto via transistor 90.

FIG. 3 illustrates a modification of the FIG. 2b arrangement, which may be employed where it is desired to have the same quadrature detector demodulate both SECAM subcarriers sequentially. In FIG. 3, the parallel element combination 94-95-96 of phase shifter 17 is subject to being shunted by the parallel combination of capacitor 98 and resistor 99 during alternate line intervals, through the action of electronic switch 100. During the intervening line intervals, the electronic switch 100 decouples the elements 98-99 from the phase shifter 17. Control of the electronic switch 100 is effected in accordance with half line rate ($f_H/2$) control waves supplied by a flip-flop circuit 101. The value of capacitor 98 is so related to the phase shifter parameters that when the aforementioned shunting is accomplished by switch 100, the phase shifter operating mode is altered to provide a phase shift of 90° for the other SECAM subcarrier frequency. An illustrative use for the FIG. 3 modification is in SECAM-PAL converters of the general type described in the aforementioned U.K. Pat. No. 1,358,551.

All of the limiter, phase shifter, and signal multiplier elements of the FIG. 2a-2b circuits, with the exception of phase shifter elements 93-94-95-96 and bypass capacitor 72, are desirably realized in integrated circuit form on a common, monolithic integrated circuit chip. Coupling to the aforesaid off-chip elements 72 and 93-94-95-96 requires utilization of only two chip terminals (at points corresponding to phase shifter terminal P, and feedback terminal F at the junction of elements 71 and 72). When the FIG. 3 embodiment is employed, flip-flop 101 and electronic switch 100 may be realized in integrated circuit form on the same monolithic integrated circuit chip bearing the limiter, multiplier, etc. In this case, elements 98 and 99 are additional off-chip elements, and an additional chip terminal is required for the coupling between switch 100 and off-chip elements 98-99.

What is claimed is:

1. In apparatus for recovering color-difference signal information from a chrominance signal encoded in SECAM fashion but undesirably subject to variations in amplitude over a given range, the combination of:
   a multi-stage limiter-amplifier responsive to said chrominance signal;
   a phase-shifting network having an input terminal for imparting to a signal supplied to said input terminal a phase shift of a frequency-dependent magnitude, said phase-shift magnitude being substantially 90° when the frequency of a signal supplied to said input terminal corresponds to a SECAM color subcarrier resting frequency;
   means for applying the output of said limiter-amplifier to said network input terminal;
   a signal multiplier, having a pair of input terminals and an output terminal, for developing at said output terminal the products of multiplication of respective signals applied to said pair of input terminals;
   means for applying the output of said limiter-amplifier to one of said signal multiplier input terminals;
   means for applying the output of said phase-shifting network to the other of said signal multiplier input terminals; and
   low pass filter means coupled to said signal multiplier output terminal for developing a color-difference signal output;
   wherein one of the stages of said multi-stage limiter-amplifier includes means for providing said one amplifier stage with a hysteresis characteristic of a form ensuring development by said limiter-amplifier of an output signal with a rectangular wave-shape possessing rise and fall times which are substantially independent of amplitude variations of the signal input to said limiter-amplifier over said given range.

2. Apparatus in accordance with claim 1 wherein said one amplifier stage has an input terminal and an output terminal and comprises a differential amplifier including:
   an input transistor having base, emitter and collector electrodes;
   an output transistor having base, emitter and collector electrodes; and
   respective signal couplings between said amplifier stage input terminal and said input transistor base electrode, between said input transistor emitter electrode and said output transistor emitter electrode, and between said output transistor collector electrode and said amplifier stage output terminal; and
   wherein said hysteresis characteristic providing means includes a load impedance coupled to said input transistor collector electrode, and means for rendering said output transistor base electrode responsive to signal voltage variations appearing across said load impedance.

3. Apparatus in accordance with claims 1 or 2 wherein said phase shifting network includes a first reactive impedance coupled between said input and output terminals of said network, a second reactive impedance coupled between said output terminal and a point of reference potential, a third reactive impedance, and electronic switching means for coupling said third reactive impedance between said output terminal and said point of reference potential when in a first switching state and for open-circuiting said third reactive impedance when in a second switching state; said reactive impedances being so related that said phase shifting network imparts a 90° phase shift to a signal at that SECAM color subcarrier resting frequency associated with R-Y color-difference information conveyance when said electronic switching means is in one of said switching states, and imparts a 90° phase shift to a signal at that SECAM color subcarrier resting frequency associated with B-Y color-difference information conveyance when said electronic switching means is in the other of said switching states; and
   wherein alteration of the switching state of said electronic switching means is effected by a control signal of a frequency corresponding to half the line repetition rate of said SECAM-encoded signal.

4. Apparatus in accordance with claims 1 or 2 wherein said one amplifier stage comprises the final amplifier stage of said limiter-amplifier, and wherein said limiter-amplifier also includes:
   (a) an input stage having an input terminal and an output terminal and comprising a differential amplifier including:
      an input transistor having base, emitter and collector electrodes;
      an output transistor having base, emitter and collector electrodes; and
      respective signal couplings between the input terminal of said input stage and the base electrode of the input transistor of said input stage, between the emitter electrodes of said input stage transistors, and between the output terminal of said input stage and the collector electrode of said output transistor of said input stage;
   (b) an intermediate stage, having an input terminal coupled to said output terminal of said input stage and an output terminal coupled to said input terminal of said final stage; and comprising a differential amplifier including:
      an input transistor having base, emitter and collector electrodes;

and output transistor having base, emitter and collector electrodes; and respective signal couplings between the input terminal of said intermediate stage and the base electrode of the input transistor of said intermediate stage, between the emitter electrodes of said intermediate stage transistors, and between the output terminal of said intermediate stage and the collector electrode of said output transistor of said intermediate stage; and (c) a direct current conductive feedback path coupled between said output terminal of said intermediate stage and the base electrode of said output transistor of said input stage.

5. Apparatus in accordance with claim 4 wherein said limiter-amplifier, said signal multiplier, all of said output applying means, and said hysteresis characteristic providing means are realized in integrated circuit form on a common monolithic integrated circuit chip; and wherein said phase shifting network includes: a first reactive impedance, coupled between said input terminal and said output terminal of said network, and realized in integrated circuit form on said chip; and a second reactive impedance, external to said chip, and coupled between the output terminal of said network and a point of reference potential.

6. Apparatus in accordance with claim 5 wherein said phase shifting network also includes a third reactive impedance external to said chip and electronic switching means for coupling said third reactive impedance in circuit with said second impedance when in a first switching state and for decoupling said third reactive impedance from said second reactive impedance when in a second switching state; said electronic switching means being realized in integrated circuit form on said chip;

wherein said reactive impedances are so related that said phase shifting network imparts a 90° phase shift to a signal at that SECAM color subcarrier resting frequency associated with R-Y color-difference information conveyance when said electronic switching means is in one of said switching states, and imparts a 90° phase shift to a signal at that SECAM color subcarrier resting frequency associated with B-Y color-difference information conveyance when said electronic switching means is in the other of said switching states; and wherein alteration of the switching state of said electronic switching means is effected by a control signal of a frequency corresponding to half the line repetition rate of said SECAM-encoded signal.

7. Apparatus in accordance with claim 5 also including a capacitor, external to said chip and coupled between a point in said feedback path and said point of reference potential; and wherein said feedback path includes a resistor, realized in integrated circuit form on said chip, and coupled between said output terminal of said intermediate stage and said feedback path point.

8. Apparatus in accordance with claim 6 also including a capacitor, external to said chip and coupled between a point in said feedback path and said point of reference potential; and wherein said feedback path includes a resistor, realized in integrated circuit form on said chip, and coupled between said output terminal of said intermediate stage and said feedback path point.

* * * * *